(12) United States Patent
Wong et al.

(10) Patent No.: US 10,916,426 B2
(45) Date of Patent: Feb. 9, 2021

(54) FORMATION OF CRYSTALLINE, LAYERED TRANSITION METAL DICHALCOGENIDES

(71) Applicant: Applied Materials, Inc., Santa Clara, CA (US)

(72) Inventors: Keith Tatseun Wong, Los Gatos, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/403,088

(22) Filed: May 3, 2019

(65) Prior Publication Data

US 2019/0362971 A1    Nov. 28, 2019

Related U.S. Application Data

(60) Provisional application No. 62/676,317, filed on May 25, 2018.

(51) Int. Cl.

| | |
|---|---|
| *H01L 21/02* | (2006.01) |
| *C23C 16/30* | (2006.01) |
| *C23C 16/455* | (2006.01) |
| *C23C 16/02* | (2006.01) |
| *H01L 21/67* | (2006.01) |
| *C01B 19/00* | (2006.01) |

(52) U.S. Cl.
CPC ...... *H01L 21/02686* (2013.01); *C01B 19/007* (2013.01); *C23C 16/0209* (2013.01); *C23C 16/305* (2013.01); *C23C 16/45527* (2013.01); *H01L 21/02499* (2013.01); *H01L 21/02568* (2013.01); *H01L 21/67098* (2013.01); *C01P 2002/01* (2013.01); *C01P 2002/20* (2013.01)

(58) Field of Classification Search
CPC combination set(s) only.
See application file for complete search history.

(56) References Cited

U.S. PATENT DOCUMENTS

| | | |
|---|---|---|
| 4,299,892 A | 11/1981 | Dines et al. |
| 4,996,108 A | 2/1991 | Divigalpitiya et al. |
| 8,500,963 B2 | 8/2013 | Ye et al. |
| 9,879,341 B2 | 1/2018 | Singh et al. |
| 2008/0092945 A1* | 4/2008 | Munteanu ............... B82Y 20/00 136/252 |
| 2015/0211112 A1 | 7/2015 | Cadot et al. |
| 2015/0311067 A1* | 10/2015 | Sharma ............. H01L 21/28202 438/783 |

(Continued)

*Primary Examiner* — Nduka E Ojeh
(74) *Attorney, Agent, or Firm* — Patterson & Sheridan, LLP (57) ABSTRACT

Embodiments of the present disclosure relate to forming a two-dimensional crystalline dichalcogenide by positioning a substrate in an annealing apparatus. The substrate includes an amorphous film of a transition metal and a chalcogenide. The film is annealed at a temperature from 500° C. to 1200° C. In response to the annealing, a two-dimensional crystalline structure is formed from the film. The two-dimensional crystalline structure is according to a formula $MX_2$, M includes one or more of molybdenum (Mo) or tungsten (W) and X includes one or more of sulfur (S), selenium (Se), or tellurium (Te).

21 Claims, 9 Drawing Sheets

(56) References Cited

U.S. PATENT DOCUMENTS

2016/0141174 A1\* 5/2016 Chiappe ............ H01L 21/02628
 257/29
2017/0267527 A1\* 9/2017 Kim .................. C23C 16/45525
2018/0151734 A1\* 5/2018 Lu ........................ H01L 29/165
2018/0308692 A1\* 10/2018 Muratore .......... H01L 21/02422
2019/0067005 A1\* 2/2019 Yun ................... H01L 21/02568

\* cited by examiner

FIG. 7B ion claims priority to U.S. Provisional Patent Application Ser. No. 62/676,317, filed on May 25, 2018, which herein is incorporated by reference.

FORMATION OF CRYSTALLINE, LAYERED TRANSITION METAL DICHALCOGENIDES

CROSS-REFERENCE TO RELATED APPLICATIONS

This application claims priority to U.S. Provisional Patent Application Ser. No. 62/676,317, filed on May 25, 2018, which herein is incorporated by reference.

BACKGROUND

Field

Embodiments of the present invention generally relate to the fabrication of substrates used in semiconductors.

Description of the Related Art

Layered transition metal dichalcogenides are two-dimensional semiconducting materials used in electronics. Transition metal dichalcogenides exhibit properties such as a direct band gap, strong spin-orbit coupling, and a lack of an inversion center, that makes transition metal dichalcogenides desirable for electronics applications. As electronics applications develop, the size of the substrates used increases, and current processes are not configured to scale up to larger substrates for commercial production. For example, currently, chemical vapor deposition (CVD) is typically used to form the layered transition metal dichalcogenides, but it is challenging to scale the CVD process to form the layered transition metal dichalcogenides on substrates of increasing diameters.

Thus, there remains a need in the art for an improved method of forming transition metal dichalcogenides on substrates.

SUMMARY

Various systems and methods for forming transition metal dichalcogenides are discussed herein. In an embodiment, a method for substrate processing includes: positioning a substrate in an annealing apparatus, wherein the substrate includes an amorphous film of a transition metal and a chalcogenide. The method further includes annealing the film at a temperature from 500° C. to 1200° C.; and forming, in response to the annealing, a two-dimensional crystalline structure from the film. The two-dimensional crystalline structure is according to a formula $MX_2$, and wherein M comprises molybdenum (Mo) or tungsten (W) and X comprises sulfur (S), selenium (Se), or tellurium (Te).

In an embodiment, a method for substrate processing includes: positioning a substrate in a laser annealing apparatus, wherein the substrate comprises an amorphous film comprising a transition metal and a chalcogenide, and annealing the film in the laser annealing apparatus at a temperature from 800° C. to 1200° C. The method further includes forming, in response to the annealing, a two-dimensional crystalline structure from the film. The two-dimensional crystalline structure is according to a formula $MX_2$, and M comprises molybdenum (Mo) or tungsten (W) and X comprises sulfur (S), selenium (Se), or tellurium (Te).

In an embodiment, another method for substrate processing includes: disposing a substrate in a rapid thermal processing (RTP) apparatus, wherein the substrate comprises an amorphous film formed over the substrate. The method further includes annealing the film using the RTP apparatus at a temperature from 800° C. to 1200° C.; and forming, in response to the annealing, a two-dimensional crystalline structure from the film. The two-dimensional crystalline structure is according to a formula $MX_2$, and M comprises molybdenum (Mo) or tungsten (W) and X comprises sulfur (S), selenium (Se), or tellurium (Te).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Two-dimensional crystalline structures are formed on substrates as discussed herein. In particular, two-dimensional crystalline transition metal dichalcogenides are formed herein using an amorphous film formed, in some examples, by atomic layer deposition (ALD) or other methods that deposit uniform films on substrates that can be from, for example, 150 nm to 450 nm in diameter. Conventional chemical vapor deposition (CVD) is traditionally used to form layered transition metal dichalcogenides. However, as substrate diameters increase along with industry demand for high volumes of electronics that use substrates with the increasing diameters, some CVD processes may not have the ability to form a uniform layered transition metal dichalcogenide film. Challenges with conventional CVD processes include precursor volatility and temperature dependency of the deposition. Thus, as substrates increase in diameter, it becomes difficult to maintain temperature uniformity across a substrate, and, thus, it is difficult to maintain film deposition uniformity across the substrate using conventional CVD. As such, a temperature-controlled CVD process or an ALD process can be used to form the amorphous transition metal dichalcogenide films discussed herein.

The ALD process includes positioning a substrate in an ALD chamber and pulsing chemical precursor gases that react with the substrate to form a film on the substrate. This pulsing control is used to form conformal films across varying substrate diameters. In one example, two precursor gases are pulsed in an alternating fashion in an ALD chamber that is held under vacuum. In an embodiment, during a first pulse of an ALD process, a first precursor gas is pulsed into the ALD chamber for a first predetermined period of time to allow the first precursor gas to react with the substrate to form a monolayer on the substrate surface in a self-limiting reaction. The ALD chamber can be subsequently purged with an inert gas such as argon (Ar) or nitrogen ($N_2$). After the purge, during a second pulse of the ALD process, a second gas is pulsed into the ALD chamber and a second monolayer is formed on the first monolayer. The first pulse of the first precursor can be referred to as a first "half-reaction," since the first pulse forms half of the intended composition of the layer, and the second pulse of the second precursor is referred to as the second half-reaction, since the cycle of the first precursor and the second precursor forms the compound composition thin film. ALD processes can be performed in ALD chambers at temperatures from about 50° C. to about 350° C. ALD can be selected as a deposition method for various applications to achieve conformal coatings, as well as for applications where film thickness control and/or film composition control are desirable. In other examples of ALD processes, a first precursor may be pulsed in the ALD chamber for a first plurality of pulses before a second precursor is pulsed in the ALD chamber for one or more pulses. The pulsing sequences, as well as other parameters such as the ALD chamber temperature and/or pressure, can thus be adjusted to form conformal films of target thicknesses and compositions to create a film that exhibits a uniform thickness across the substrate.

The film discussed herein includes an amorphous transition metal dichalcogenide that is annealed in one or more annealing operations to form a two-dimensional crystalline transition metal dichalcogenide from the amorphous film. The two-dimensional crystalline transition metal dichalcogenide is according to a formula of $MX_2$, wherein M includes molybdenum (Mo) or tungsten (W) and X includes sulfur (S), selenium (Se), or tellurium (Te). When ALD is used to deposit the amorphous film, the film can contain one or more impurities of carbon (C), nitrogen (N), or silicon (Si), the impurities are reduced or eliminated via the annealing operations discussed herein, such that any remaining impurities in or on the film do not negatively impact subsequent operations such as the deposition of additional layers on the two-dimensional crystalline transition metal dichalcogenide layer.

Figure 1:
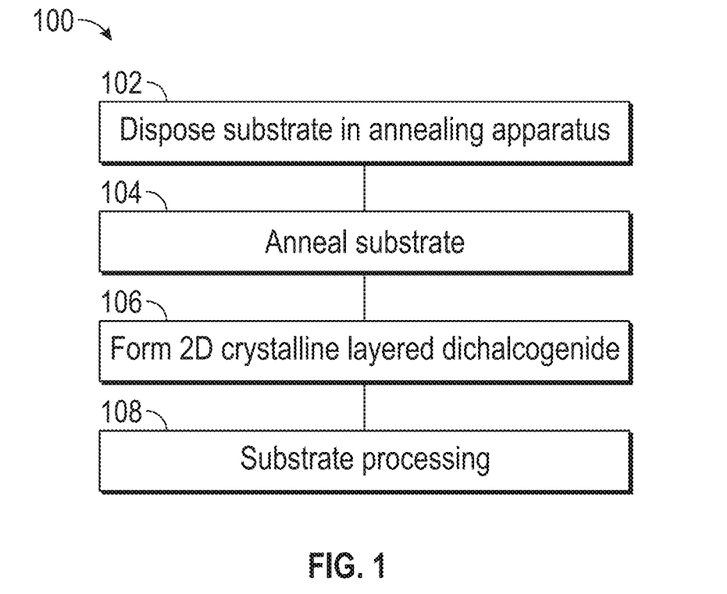
FIG. 1 is a flow chart of a method of forming a two-dimensional crystalline transition metal dichalcogenide film on a substrate according to embodiments of the present disclosure.
Figure 2A:
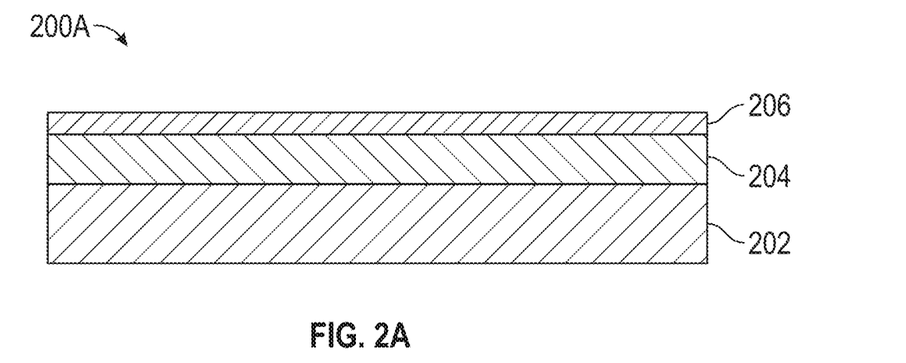
FIGS. 2A and 2B are schematic illustrations of a substrate during different stages of a deposition process according to embodiments of the present disclosure.
Figure 2B:
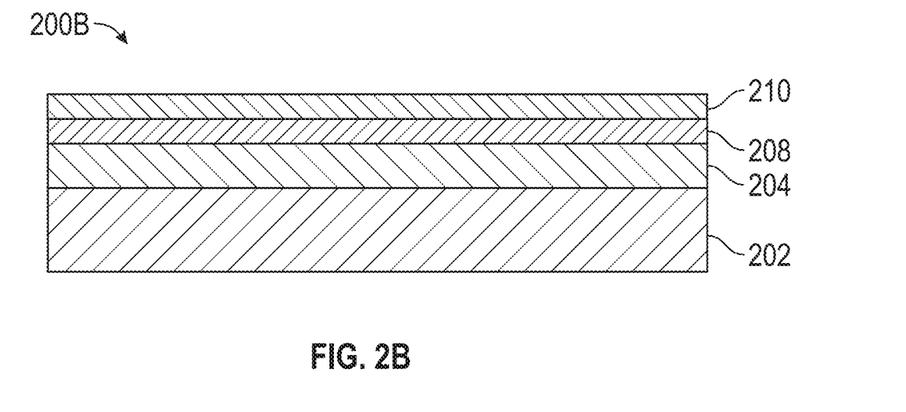

FIG. 1 is a flow chart of a method 100 of forming a two-dimensional crystalline transition metal dichalcogenide on a substrate according to embodiments of the present disclosure. FIGS. 2A and 2B are schematic illustrations of a substrate according to embodiments of the present disclosure. FIGS. 1 and 2A-2B are discussed together below. In an embodiment of the method 100, at operation 102, one or more substrates such as the substrate structure 200A are disposed in an annealing apparatus. FIG. 2A is a substrate structure 200A that includes a silicon substrate 202 and an oxide layer 204 formed on the substrate 202. The oxide layer 204 may include one or more of $SiO_2$, $HfO_2$, $Si_3N_4$, or $Al_2O_3$. In an embodiment, the oxide layer 204 has a thickness from 0.5 nm to 300 nm. Further in FIG. 2A, an amorphous film 206 is formed over the oxide layer 204. The amorphous film 206 includes a transition metal dichalcogenide and is deposited, for example, using ALD, to a thickness from 0.5 nm to 100 nm. The one or more substrates disposed in the annealing apparatus at operation 102 each includes the amorphous film 206 formed on the oxide layer 204. The amorphous film 206 is a transition metal dichalcogenide and can include impurities such as Si, N, or C. At operation 104, the amorphous film 206 is annealed using one or more annealing apparatuses such as a pedestal furnace, a microwave annealing apparatus, a lamp-based rapid thermal processing (RTP) apparatus, or a laser annealing apparatus that can be dynamic surface annealing (DSA) laser that operates at a wavelength of 810 nm or a 532 nm.

FIG. 2B shows an annealed substrate structure 200B subsequent to annealing at operation 104. The annealed substrate structure 200B has the substrate 202, the oxide layer 204 formed over the substrate 202, and a two-dimensional crystalline transition metal dichalcogenide layer 208 formed from the amorphous film 206 at operation 106 in response to the annealing at operation 104. In an embodiment, the two-dimensional crystalline transition metal dichalcogenide layer 208 has a thickness from 0.5 nm to 100 nm, and is according to a formula of $MX_2$, wherein M includes one or more of molybdenum (Mo) or tungsten (W) and X includes one or more of sulfur (S), selenium (Se), or tellurium (Te). In an embodiment, the two-dimensional crystalline transition metal dichalcogenide layer 208 formed at operation 106 comprises a thickness from about 50% to about 80% of the thickness of the amorphous film 206. In some embodiments, as shown in FIG. 2B, the annealing at operation 106 forms an interface layer 210 on top of the two-dimensional crystalline transition metal dichalcogenide layer 208. In an embodiment, the interface layer 210 includes $MoO_3$, C, or other impurities released from the layer 208 during annealing at operation 104. The composition of the interface layer 210 can vary depending upon the composition of the amorphous film 206 as well as its deposition method. In some examples, no interface layer 210 is formed. Table 1 shows examples of a number of ALD deposition cycles performed to form the amorphous film 206 as discussed herein. Table 1 further shows a corresponding value of an average thickness of the annealed, two-dimensional crystalline transition metal dichalcogenide layer 208 formed from the amorphous film 206.

TABLE 1

Number of ALD Cycles and Annealed layer thickness

| Number of ALD cycles used to form amorphous film | Thickness of annealed crystalline layer (nm) |
|---|---|
| 5 | 0.9 |
| 10 | 1.2 |
| 15 | 2.1 |
| 20 | 2.5 |
| 80 | 7.6 |

Subsequent to the formation of the two-dimensional crystalline transition metal dichalcogenide 208 at operation 106, a plurality of operations can be performed at operation 108. The plurality of operations that can occur at operation 108 can include depositing additional layers on the $MX_2$ layer using one or more of the ALD chambers, a physical vapor deposition (PVD) process including plasma-enabled PVD in a PVD chamber, a chemical vapor deposition (CVD) process in a CVD chamber, lithography, imprinting, or other operations or combinations of operations. In various examples at operation 108, the annealed substrate structure 200B can have additional layers deposited thereon and/or patterned. The interface layer 210 does not negatively impact further processing at operation 108. In some examples, the interface layer 210 can be removed via a wet or a dry pre-cleaning operation prior to depositing subsequent layers on the substrate.

In an embodiment of the method 100, at operation 104, the annealing apparatus is a furnace or a hot pedestal annealing apparatus. In this example, a substrate structure 200A coated with the amorphous film 206 is disposed on the hot pedestal or in the hot furnace annealing apparatus and annealed at a temperature from 500° C. to 1200° C. The substrate structure 200A can be annealed for a time period from about 60 seconds to about 1800 seconds. In this example, the annealing in the hot pedestal annealing apparatus occurs under vacuum and one or more of Ar, $N_2$, $H_2S$ and/or $H_2Se$ are present in the hot pedestal annealing apparatus during the annealing at operation 104.

In an alternate embodiment of the method 100, at operation 104, the annealing apparatus is a microwave annealing apparatus. In this example, a substrate structure 200A coated with the amorphous film 206 is disposed in the furnace or in the microwave annealing apparatus and annealed at a temperature from 800° C. to 1200° C. from about 1 second to about 600 seconds. In this example, the annealing occurs while the microwave annealing apparatus is under vacuum and one or more of Ar, $N_2$, $H_2S$ and/or $H_2Se$ are present in the microwave annealing apparatus during the annealing at operation 104.

In another embodiment of the method 100, at operation 104, the annealing apparatus is an RTP apparatus such as a lamp-based RTP apparatus. Lamp-based RTP processes use high-intensity lamps to apply heat to a substrate, increasing a temperature of a substrate, such as the substrate structure 200A, and then cooling the substrate to a predetermined temperature at a rate that prevents dislocation formation in and breakage of the substrate. In this example, a substrate 202 coated with the amorphous film 206 is annealed at a temperature from 800° C. to 1200° C. from about 1 seconds to about 300 seconds at operation 104. In this example, the annealing at operation 104 in the lamp-based RTP apparatus occurs while the lamp-based RTP apparatus is under vacuum, and one or more of Ar, $N_2$, $H_2S$ and/or $H_2Se$ are present during the annealing.

In another embodiment of the method 100, at operation 104, the annealing apparatus is a DSA laser annealing apparatus such as an 810 nm laser annealing apparatus or a 510 nm laser annealing apparatus. In an example where the 810 nm laser annealing apparatus is used at operation 104, a substrate 202 coated with the amorphous film 206. The amorphous film 206 can be an ALD-deposited film. The substrate 202 coated with the amorphous film 206 is positioned in the 810 nm laser annealing apparatus and annealed a temperature from 800° C. to 1200° C. from about 1 µs to about 1000 µs. In this example, the annealing occurs while one or more of Ar, $N_2$, $NH_3$, $H_2S$ and/or $H_2Se$ are present in the 810 nm laser annealing apparatus. In another laser annealing example where the 532 nm laser annealing apparatus is used at operation 104, a substrate 202 or substrates coated with the amorphous film 206 is positioned in the 532 nm laser annealing apparatus and annealed a temperature from 800° C. to 1200° C. In this example, the annealing can occur during a time periods from about 1 ns to about 500 µs. In this example, the annealing occurs while one or more of Ar, $N_2$, $H_2S$ and/or $H_2Se$ are present in the 532 nm laser annealing apparatus.

Figure 3:
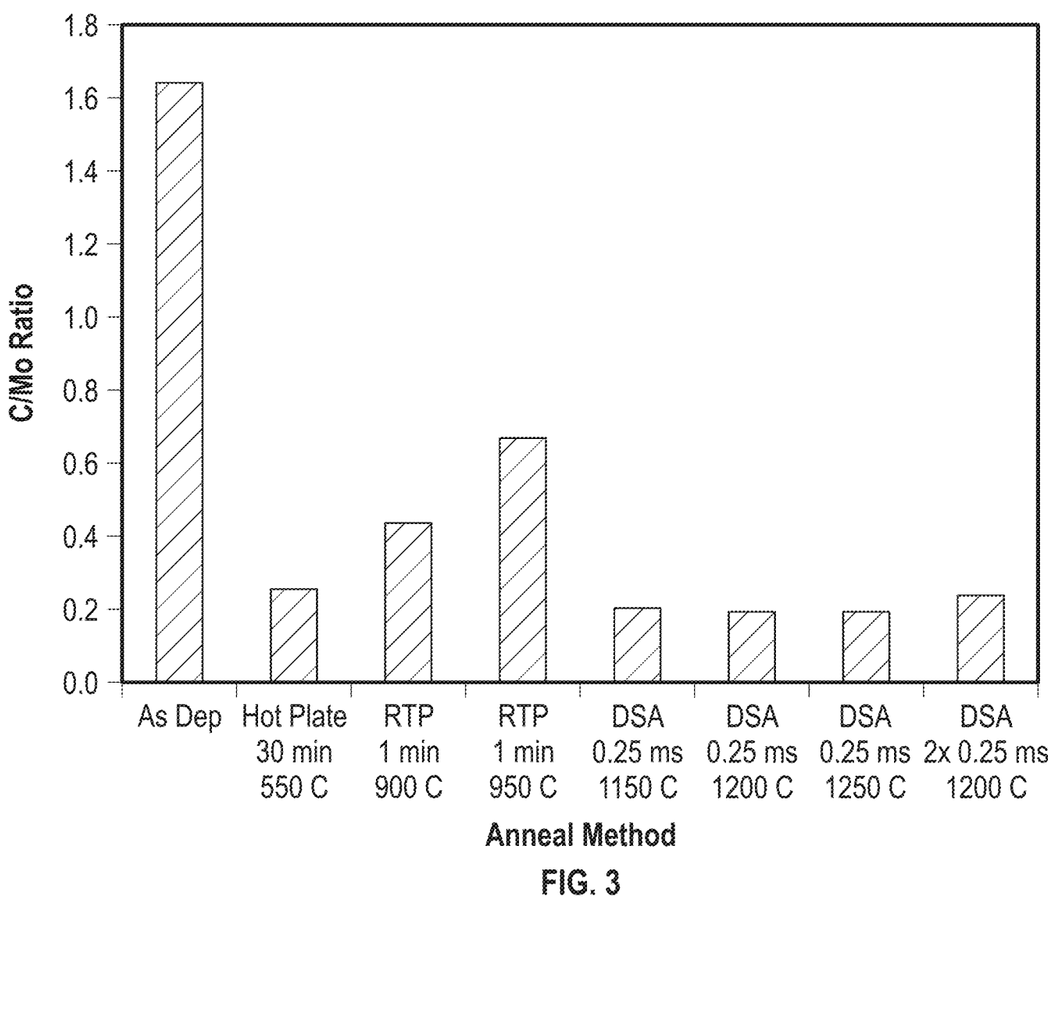
FIG. 3 is a graph demonstrating that annealing apparatuses reduce film impurities in the ALD-deposited films formed according to embodiments of the present disclosure.

FIG. 3 is a graph of impurities in an amorphous transition metal dichalcogenide film, labeled "as dep," as compared to the two-dimensional crystalline transition metal dichalcogenide layer formed according to embodiments of the present disclosure. In particular, FIG. 3 shows how annealing apparatuses reduce film impurities in the ALD-deposited films discussed herein. As shown in FIG. 3, the annealing at operation 106 of FIG. 1 reduces undesirable impurities such as carbon in the film. In the example in FIG. 3, the amorphous film impurity is a carbon (C) impurity, which is expressed as a ratio of C:Mo, where Mo is the "M" element of the $MX_2$ two-dimensional crystalline structure. In one example, annealing reduces carbon impurity to an example "M" element of Mo (C:Mo) from about 1.6:1 in the as-deposited amorphous film, to about 0.4:1 in the two-dimensional crystalline transition metal dichalcogenide layer 208 formed from the amorphous film. In another example, the annealing reduces the film impurities from about 5:1 in the as-deposited amorphous film, to about 0.2:1 in the two-dimensional crystalline transition metal dichalcogenide layer 208 formed from the amorphous film. Thus, the two-dimensional crystalline transition metal dichalcogenide layer 208 discussed herein includes a C:Mo impurity ratio from 0.50:1 to 2.00:1. In some embodiments, some or all of the C remaining after annealing may be adventitious C on the surface. All XPS analysis are done ex-situ so, during exposure to air, there can be carbon species adsorbed on the surface. The amount of C observed is thus in line with amounts typically seen for adventitious C.

Figure 4:
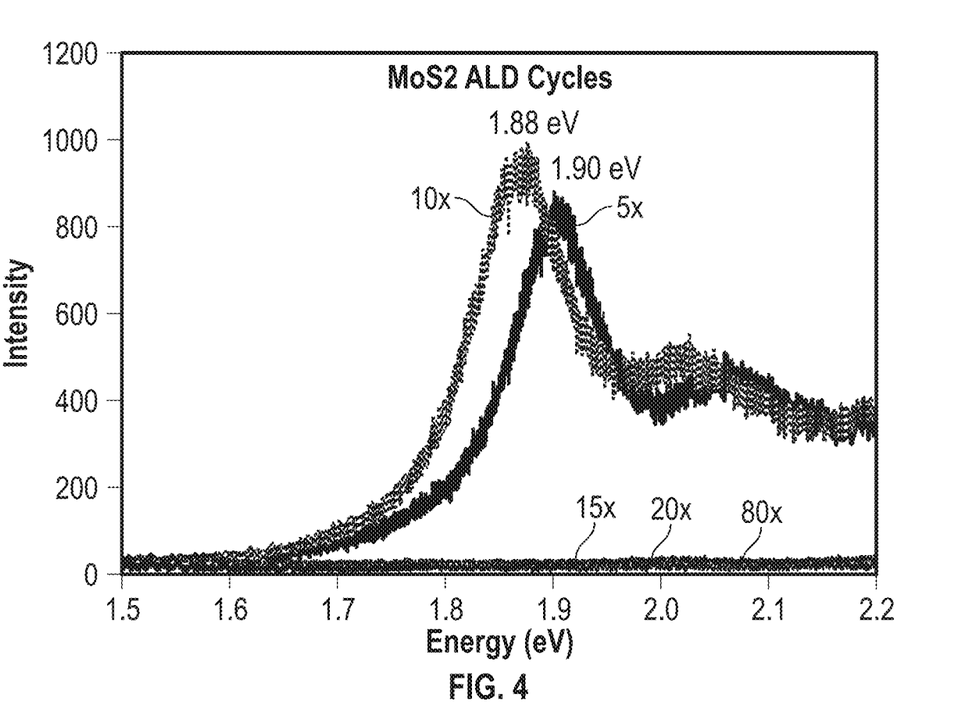
FIG. 4 is a graph of photoluminescence of a two-dimensional crystalline transition metal dichalcogenide formed from an amorphous film by rapid thermal processing at 900° C. according to embodiments of the present disclosure.

FIG. 4 is a graph of photoluminescence of a two-dimensional crystalline transition metal dichalcogenide formed from an amorphous film by rapid thermal processing at 900° C. according to embodiments of the present disclosure. FIG. 3 shows a plurality of $MoS_2$ films fabricated using from 5 ALD deposition cycles to 80 ALD deposition cycles according to embodiments of the present disclosure. Photoluminescence was used to determine the quality of the two-dimensional crystalline metal dichalcogenide formed on the substrate. Thus, FIG. 4 shows that RTP annealing at 900° C. results in a photoluminescence peak at 1.88 eV for thin (e.g., 1-3 monolayers; 2 monolayers) $MoS_2$ due to direct band gap, confirming the desired formation of $MoS_2$ by the RTP annealing. The two-dimensional crystalline metal dichalcogenide is a thin layer, and if the layer is too thick, the band gap will become indirect resulting in the material exhibiting no photoluminescence, as seen for $MoS_2$ films fabricated using from 15 ALD deposition cycles to 80 ALD deposition cycles (from ~3 monolayers to ~16 monolayers).

Figure 5A:
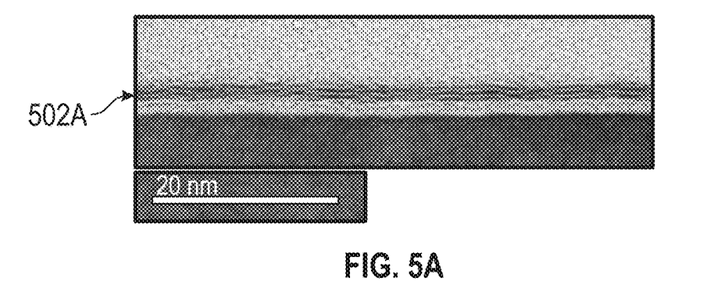
FIGS. 5A-5J are transmission electron microscopy (TEM) images of two-dimensional transition metal crystalline dichalcogenides formed on substrates according to embodiments of the present disclosure.
Figure 5B:
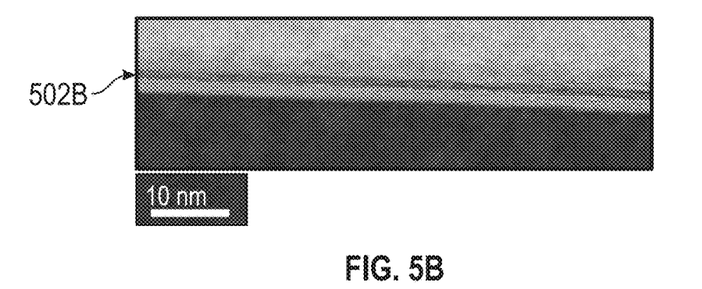

FIGS. 5A-5J are transmission electron microscopy (TEM) images of two-dimensional transition metal crystalline dichalcogenides formed on substrates according to embodiments of the present disclosure. FIG. 5A is a TEM image of a substrate with a two-dimensional transition metal crystalline dichalcogenide layer 502A formed using a hot pedestal anneal for about 30 minutes at about 550° C. in an Ar atmosphere. FIG. 5B is a TEM image of a substrate with a two-dimensional transition metal crystalline dichalcogenide layer 502B formed using RTP for about 1 minute at about 950° C. in a $N_2$ atmosphere.

Figure 5C:
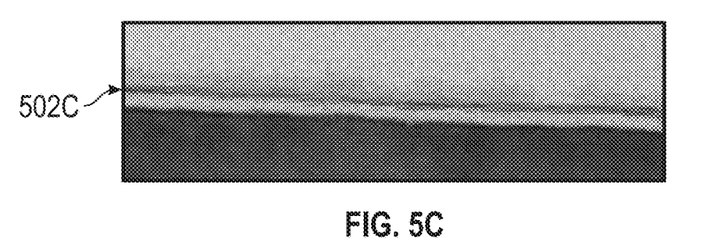
Figure 5D:
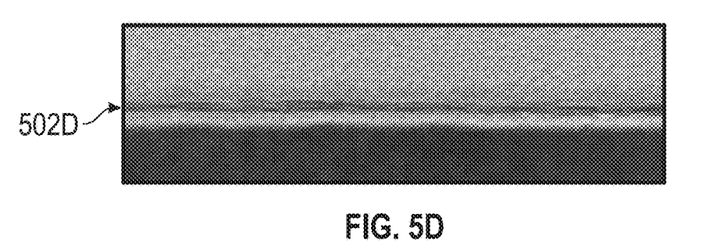
Figure 5E:
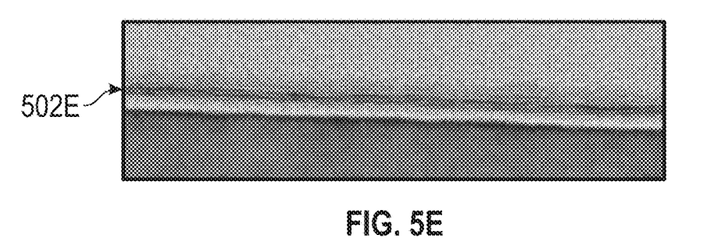
Figure 5F:
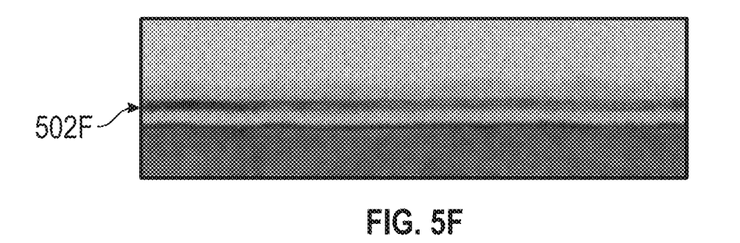
Figure 5G:
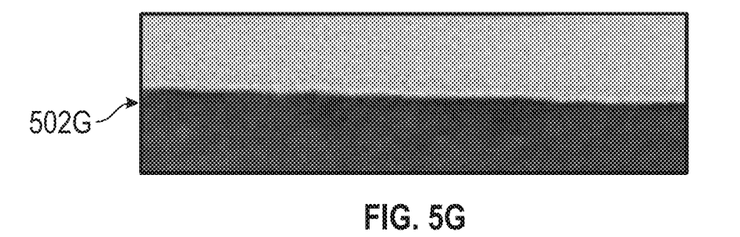
Figure 5H:
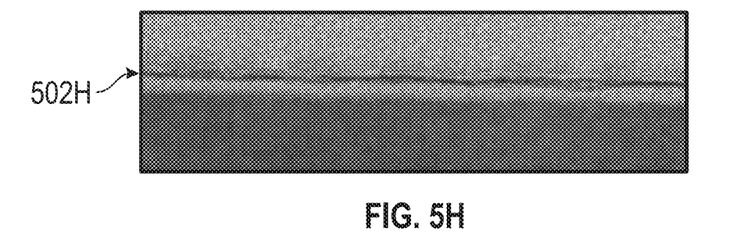

FIGS. 5C-5J are TEM images of substrates, each with a two-dimensional transition metal crystalline dichalcogenide layer formed via laser annealing using a 810 nm laser. FIG. 5C is a TEM image of a substrate with a two-dimensional transition metal crystalline dichalcogenide layer 502C formed using laser annealing for about 0.25 milliseconds (ms) at 1100° C. in a $N_2$ atmosphere. FIG. 5G is a TEM image of a substrate with a two-dimensional transition metal crystalline dichalcogenide layer 502G formed using laser annealing for about 0.25 ms at 1100° C. in a $NH_3$ atmosphere. FIG. 5D is a TEM image of a substrate with a two-dimensional transition metal crystalline dichalcogenide layer 502D formed using laser annealing for about 0.25 ms at 1150° C. in a $N_2$ atmosphere. FIG. 5H is a TEM image of a substrate with a two-dimensional transition metal crystalline dichalcogenide layer 502H formed using laser annealing for about 0.25 ms at 1150° C. in a $NH_3$ atmosphere.

Figure 5I:
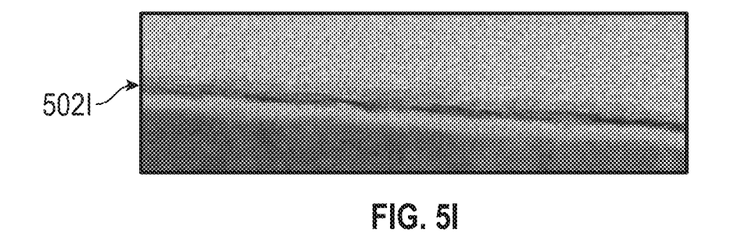
Figure 5J:
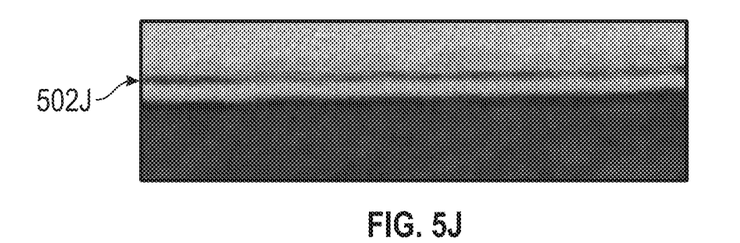

FIG. 5E is a TEM image of a substrate with a two-dimensional transition metal crystalline dichalcogenide layer 502E formed using laser annealing for about 0.25 ms at 1200° C. in a $N_2$ atmosphere. FIG. 5I is a TEM image of a substrate with a two-dimensional transition metal crystalline dichalcogenide layer 502I formed using laser annealing for about 0.25 ms at 1200° C. in a $NH_3$ atmosphere. FIG. 5F is a TEM image of a substrate with a two-dimensional transition metal crystalline dichalcogenide layer 502F formed using laser annealing for about 0.50 ms at 1150° C. in a $N_2$ atmosphere. FIG. 5J is a TEM image of a substrate with a two-dimensional transition metal crystalline dichalcogenide layer 502J formed using laser annealing for about 0.50 ms at 1150° C. in a $NH_3$ atmosphere.

Figure 6A:
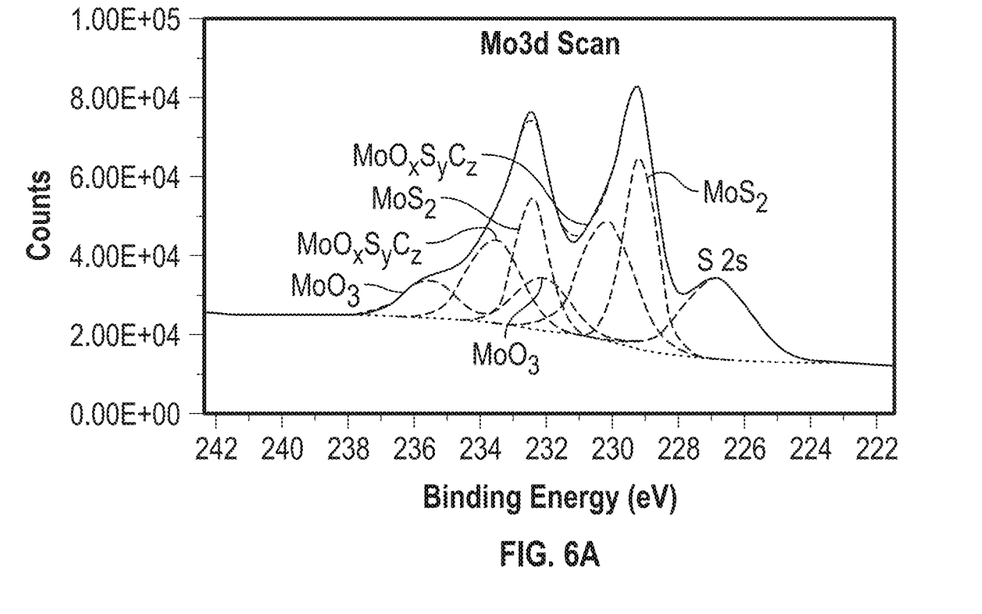
FIGS. 6A-6F are x-ray photoelectron spectroscopy (XPS) graphs of amorphous transition metal dichalcogenide layers as-deposited and two-dimensional transition metal crystalline dichalcogenide layer formed via annealing according to embodiments of the present disclosure.
Figure 6B:
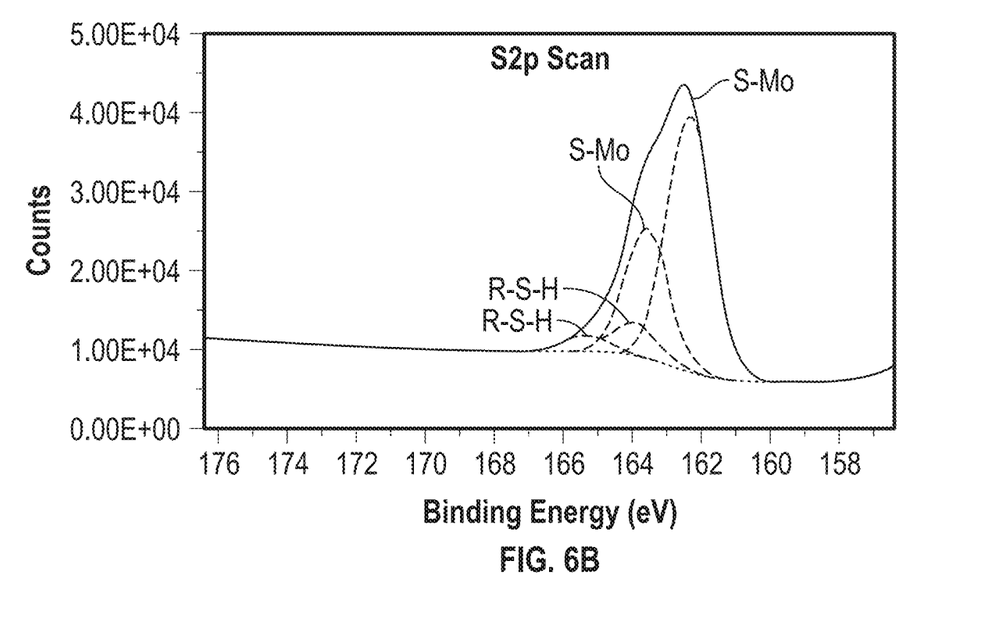

FIGS. 6A-6F are x-ray photoelectron spectroscopy (XPS) graphs of amorphous transition metal dichalcogenide layers as-deposited and two-dimensional transition metal crystalline dichalcogenide layer formed via annealing using RTP or an 810 nm laser according to embodiments of the present disclosure. FIG. 6A is a Mo 3-D XPS scan of an amorphous transition metal dichalcogenide layer as-deposited by ALD. As shown in FIG. 6A, there is Mo in the $MoS_2$, there is also $MoO_3$ present, as well as Mo sub-oxides. The Mo sub-oxides are shown, for example, in FIG. 6A as $MoO_xS_yC_z$. The Mo sub-oxides can be Mo bonded to one or more of O, S, or C. FIG. 6B is a graph of an S2p spectrum before annealing, the S—Mo peaks identified indicate that S is bonded to Mo in molybdenum thiolate.

Figure 6C:
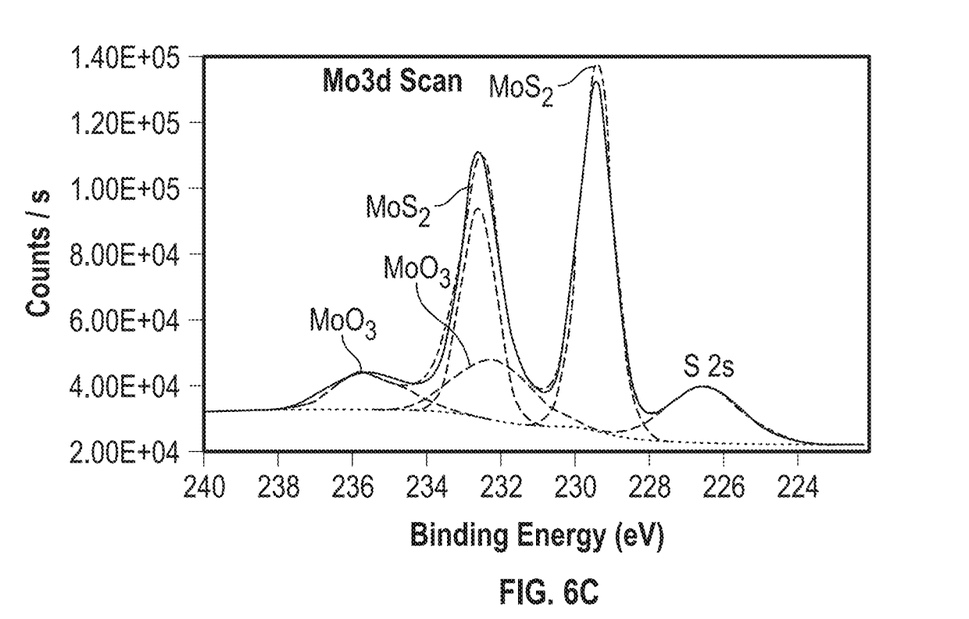
Figure 6D:
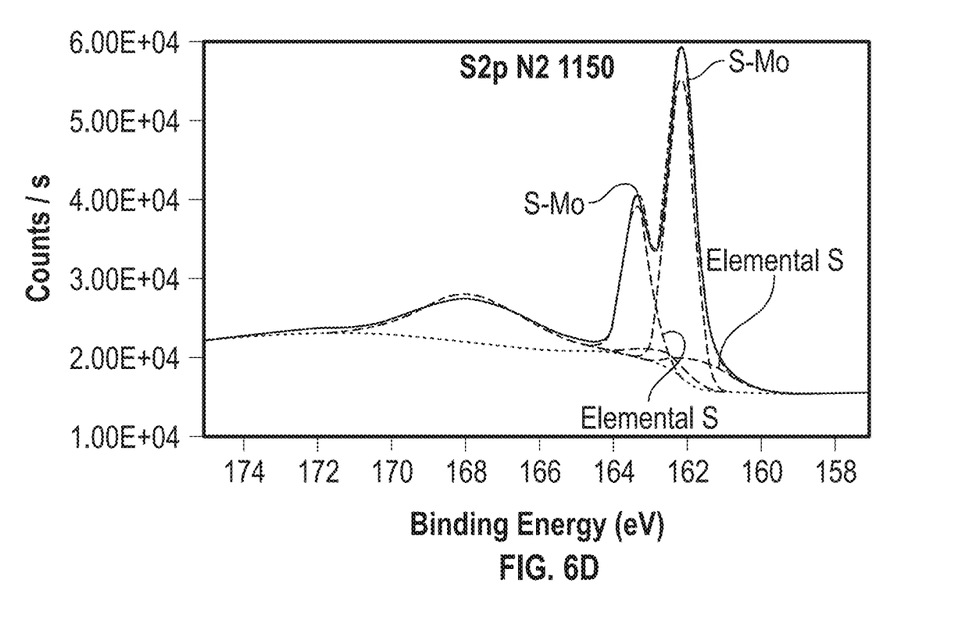

FIG. 6C is an Mo 3d XPS scan of a two-dimensional transition metal crystalline dichalcogenide layer formed via laser annealing with a 810 nm laser. As shown in FIG. 6C, the Mo 3d spectrum is converted, as compared to the amorphous film spectrum of FIG. 6A, to two doublets—one "sharp" (steeper slope) doublet corresponding to $MoS_2$ and a "wider" (gradual slope as compared to the sharp double) doublet due to residual $MoO_3$. Some or all of the $MoO_3$ may be formed at the surface upon exposure to air between anneal and XPS analysis. That is, the film may be (more) pure $MoS_2$ after annealing but without in situ analysis or capping there is an oxidation of the top surface. FIG. 6D is a graph of an S2p spectrum of a two-dimensional transition metal crystalline dichalcogenide layer formed via laser annealing with an 810 nm laser. FIG. 6D shows that the S2p spectrum, as compared to the amorphous film of FIG. 6B, is converted via the laser annealing to a sharp peak corresponding to S—Mo and only a comparatively small amount of elemental S. The two-dimensional transition metal crystalline dichalcogenide layer of FIGS. 6C and 6D is formed using laser annealing for about 0.25 ms at about 1150° C. in a $N_2$ atmosphere.

Figure 6E:
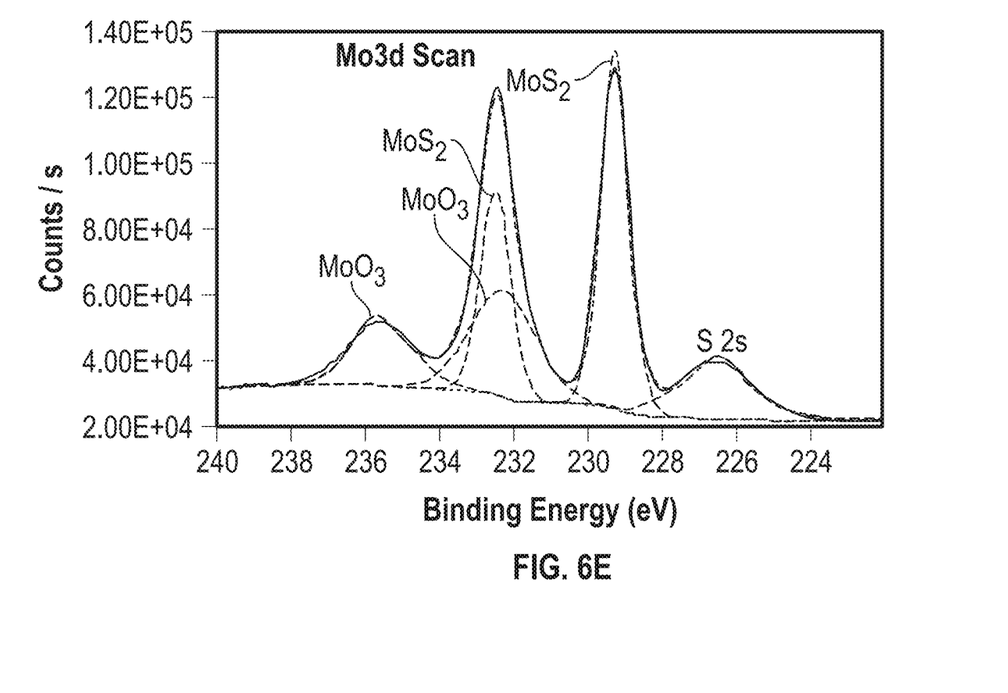
Figure 6F:
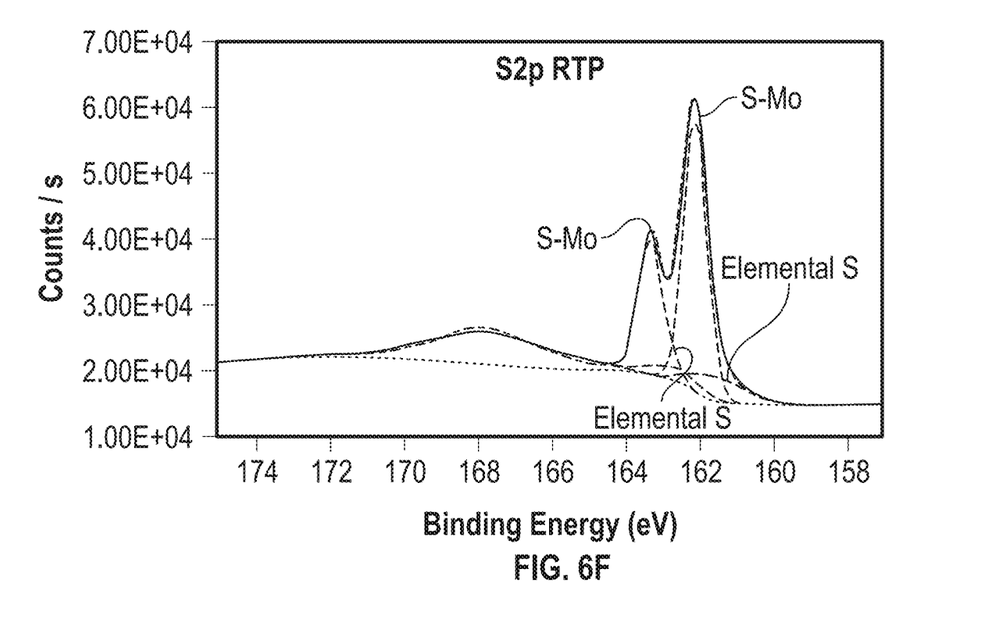

FIG. 6E is an Mo 3d XPS scan of a two-dimensional transition metal crystalline dichalcogenide layer formed via RTP annealing for about 1 minute at about 950° C. As shown in FIG. 6E, the Mo 3d spectrum is converted, as compared to the amorphous film spectrum of FIG. 6A, to two doublets—one "sharp" (steeper slope) doublet corresponding to $MoS_2$ and a "wider" (gradual slope as compared to the sharp double) doublet due to residual $MoO_3$. FIG. 6F is a graph of an S2p spectrum of a two-dimensional transition metal crystalline dichalcogenide layer formed via RTP annealing for about 1 minute at about 950° C. FIG. 6F shows that the S2p spectrum, as compared to the amorphous film of FIG. 6B, is converted via the laser annealing to a sharp peak corresponding to S—Mo and only a comparatively small amount of elemental S. Thus, FIGS. 6C-6E, in particular the sharp $MoS_2$ peaks, confirm that there is an improvement in chemical composition of the amorphous film after annealing to form the two-dimensional transition metal crystalline dichalcogenide layer.

Figure 7A:
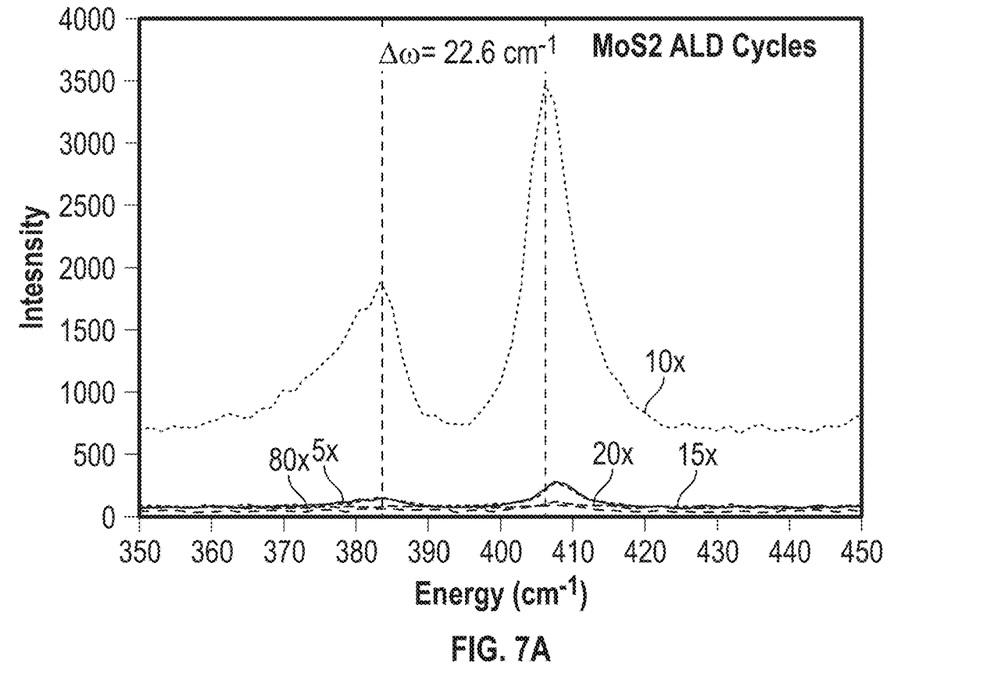
FIGS. 7A and 7B are Raman spectra of the two-dimensional transition metal crystalline dichalcogenide layers formed according to embodiments of the present disclosure.
Figure 7B:
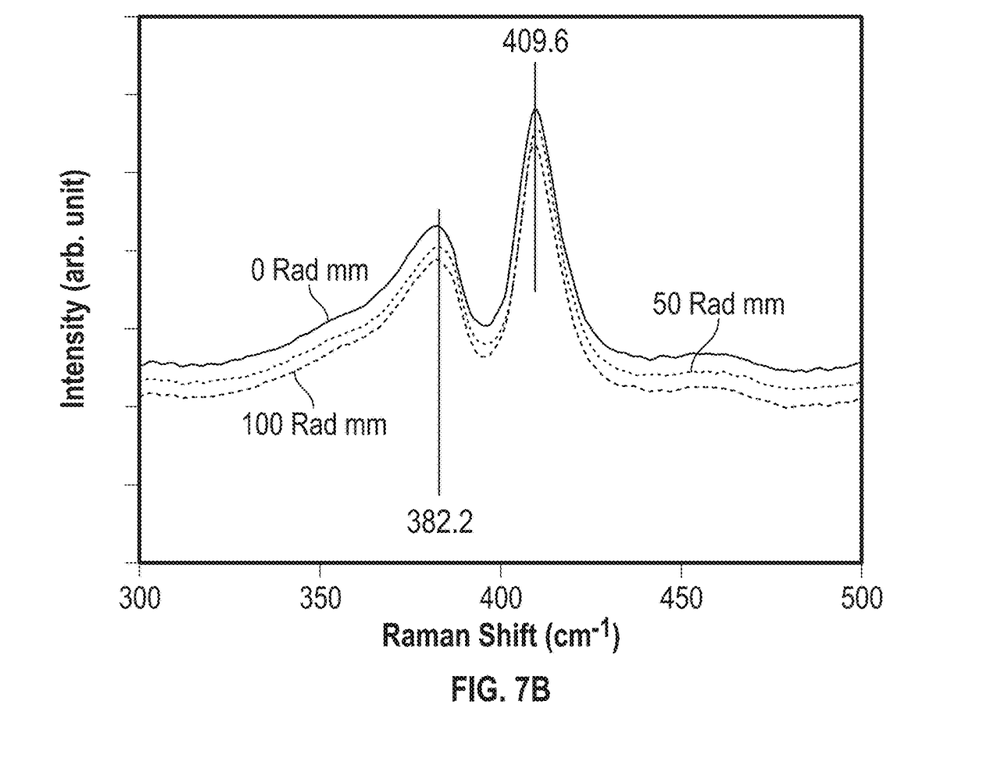

FIGS. 7A and 7B are Raman spectra of the two-dimensional transition metal crystalline dichalcogenide layers formed according to embodiments of the present disclosure. FIG. 7A is a Raman spectra of a two-dimensional transition metal crystalline dichalcogenide layer formed using RTP at about 900° C. for about 1 minute. As shown in FIG. 7A, the Raman peaks corresponding to a crystalline $MoS_2$ layer are observed after the RTP 900° C. anneal. Further, the separation between the $A_{1g}$ and $E^1_{2g}$ Raman peaks for the cycle deposited with 10 ALD cycles is consistent with 2-3 monolayers of $MoS_2$. FIG. 7B is a Raman spectra show characteristic $MoS_2$ peaks, an out-of-plane mode $A_{1g}$ at 409.6 $cm^{-3}$ and an in-plane mode $E^1_{2g}$ at 409.6 $cm^{-3}$ of an amorphous-as-deposited transition metal dichalcogenide formed on an $SiO_2$ layer using 15 ALD cycles after annealing in a furnace at about 550° C. While a 10-ALD cycle deposition is shown as including the $MoS_2$ peaks in FIG. 7A, in other examples, using various deposition methods and/or annealing methods, ALD processes with more or less than 10 cycles can also be used to form the amorphous film.

The two-dimensional crystalline transition metal dichalcogenide layers formed from the amorphous films discussed herein can thus be formed on substrates on the order of 150 nm to 450 nm via one or more annealing operations, creating a crystalline transition metal dichalcogenide layer suitable for the formation, patterning, and further processing of layers formed on top of the crystalline transition metal dichalcogenide layer.

While the foregoing is directed to embodiments of the present disclosure, other and further embodiments of the disclosure may be devised without departing from the basic scope thereof, and the scope thereof is determined by the claims that follow.

What is claimed is:
1. A method for substrate processing, comprising:
positioning a substrate in an annealing apparatus, wherein the substrate comprises an amorphous film of a transition metal and a chalcogenide;
annealing the amorphous film at a temperature from 500° C. to 1200° C.; and
forming, in response to the annealing, a two-dimensional crystalline structure from the amorphous film, wherein the two-dimensional crystalline structure is according to a formula $MX_2$, and wherein M comprises molybdenum (Mo) or tungsten (W) and X comprises sulfur (S), selenium (Se), or tellurium (Te), wherein the amorphous film comprises an impurity, wherein a ratio of the impurity to the M element of the two-dimensional crystalline structure (impurity: M) is from 0.50:1 to 2.00:1.

2. The method of claim 1, wherein the substrate comprises a metal, a semiconductor, a polymer, an inorganic oxide, a metal oxide, a metal sulfide, a metal selenide, an inorganic sulfide, graphene, an inorganic selenide, or combinations thereof.

3. The method of claim 1, wherein the two-dimensional crystalline structure comprises a plurality of monolayers.

4. The method of claim 1, wherein the annealing further comprises annealing in an atmosphere comprising argon (Ar) and nitrogen ($N_2$).

5. The method of claim 1, wherein the annealing further comprises exposing the amorphous film to hydrogen sulfide ($H_2S$) and hydrogen selenide ($H_2Se$).

6. The method of claim 1, where the amorphous film comprises a thickness from 0.5 nm to 100 nm, and wherein the two-dimensional crystalline structure comprises a thickness from 50% to 80% of the thickness of the amorphous film.

7. The method of claim 1, wherein the annealing apparatus comprises a hot pedestal, a hot furnace, a microwave annealing apparatus, a lamp-based rapid thermal processing (RTP) apparatus, or a laser annealing apparatus.

8. The method of claim 1, wherein the substrate comprises $SiO_2$, or $Si_3N_4$.

9. The method of claim 1, wherein the impurity comprises carbon, nitrogen, or silicon.

10. A method for substrate processing, comprising:
positioning a substrate in a laser annealing apparatus, wherein the substrate comprises an amorphous film comprising a transition metal and a chalcogenide;
annealing the amorphous film in the laser annealing apparatus at a temperature from 800° C. to 1200° C.; and
forming, in response to the annealing, a two-dimensional crystalline structure from the amorphous film, wherein the two-dimensional crystalline structure is according to a formula $MX_2$, and wherein M comprises molybdenum (Mo) or tungsten (W) and X comprises sulfur (S), selenium (Se), or tellurium (Te),wherein the amorphous film comprises an impurity, wherein a ratio of the annealing the amorphous film using the RTP apparatus at a temperature from 800° C. to 1200° C.; and
forming, in response to the annealing, a two-dimensional crystalline structure from the amorphous film, wherein the two-dimensional crystalline structure is according to a formula $MX_2$, wherein M comprises molybdenum (Mo) or tungsten (W) and X comprises sulfur (S), selenium (Se), or tellurium (Te), wherein the amorphous film comprises an impurity, wherein a ratio of the impurity to the M element of the two-dimensional crystalline structure (impurity: M) is from 0.50:1 to 2.00:1.

11. The method of claim 10, wherein the substrate comprises a metal, a semiconductor, a polymer, an inorganic oxide, a metal oxide, a metal sulfide, a metal selenide, an inorganic sulfide, graphene, an inorganic selenide, or combinations thereof.

12. The method of claim 10, wherein the annealing further comprises annealing in an atmosphere comprising argon (Ar) and nitrogen ($N_2$).

13. The method of claim 12, wherein the annealing further comprises exposing the amorphous film to hydrogen sulfide ($H_2S$) and hydrogen selenide ($H_2Se$).

14. The method of claim 10, wherein the two-dimensional crystalline structure comprises a thickness from 50% to 80% of a thickness of the amorphous film.

15. The method of claim 10, wherein the annealing apparatus comprises a 532 nm laser apparatus and the annealing is for a period of time from about 1 ns to about 500 ns.

16. The method of claim 10, wherein the annealing apparatus comprises a 810 nm laser apparatus the annealing is for a period of time from 1 µs to 1000 µs.

17. A method for substrate processing, comprising:
positioning a substrate in a rapid thermal processing (RTP) apparatus, wherein the substrate comprises an amorphous film formed over the substrate; according to a formula $MX_2$, and wherein M comprises molybdenum (Mo) or tungsten (W) and X comprises sulfur (S), selenium (Se), or tellurium (Te), wherein the amorphous film comprises a second plurality of impurities, wherein a ratio of the second plurality of impurities to the M element of the two-dimensional crystalline structure (second plurality of impurities: M) is from 0.50:1 to 2.00:1;
exposing, during the annealing, the amorphous film to hydrogen sulfide ($H_2S$) and hydrogen selenide ($H_2Se$); and
removing the interface layer.

18. The method of claim 17, wherein the substrate comprises silicon (Si) and a layer of $SiO_2$ is formed on the substrate, wherein the amorphous film is formed over the layer of $SiO_2$.

19. The method of claim 17, wherein the impurity comprises carbon, nitrogen, or silicon.

20. The method of claim 17, wherein the two-dimensional crystalline structure comprises a thickness from 50% to 80% of a thickness of the amorphous film.

21. A method for substrate processing, comprising:
positioning a substrate in an annealing apparatus, wherein the substrate comprises an amorphous film of a transition metal and a chalcogenide;
annealing the amorphous film at a temperature from 500° C. to 1200° C. to form a two-dimensional crystalline structure from the amorphous film and an interface layer in contact with the two-dimensional crystalline structure, the interface layer including a first plurality of impurities released from the amorphous film during the annealing, wherein the two-dimensional crystalline structure is impurity to the M element of the two-dimensional crystalline structure (impurity: M) is from 0.50:1 to 2.00:1.

* * * * *